US005627391A

United States Patent [19]
Shimada et al.

[11] Patent Number: 5,627,391
[45] Date of Patent: May 6, 1997

[54] SEMICONDUCTOR DEVICE AND METHOD OF MANUFACTURING THE SAME

[75] Inventors: Yasuhiro Shimada, Osaka; Atsuo Inoue, Kyoto; Koji Arita, Osaka; Toru Nasu, Kyoto; Yoshihisa Nagano; Akihiro Matsuda, both of Osaka, all of Japan

[73] Assignee: Matsushita Electronics Corporation, Osaka, Japan

[21] Appl. No.: 492,913

[22] Filed: Jun. 20, 1995

[30] Foreign Application Priority Data

Jun. 28, 1994 [JP] Japan ................. 6-146265

[51] Int. Cl.⁶ .................. H01L 29/76; H01L 27/108; H01L 23/48
[52] U.S. Cl. .................. 257/310; 257/295; 257/296; 257/300; 257/306; 257/309; 257/751
[58] Field of Search .................. 257/751, 295, 257/298, 296, 300, 306, 309, 310

[56] References Cited

U.S. PATENT DOCUMENTS

| | | | |
|---|---|---|---|
| 4,141,022 | 2/1979 | Sigg et al. | 357/23 |
| 5,436,477 | 7/1995 | Hashizume et al. | 257/295 |

FOREIGN PATENT DOCUMENTS

| | | |
|---|---|---|
| 0404295 | 12/1990 | European Pat. Off. . |
| 0513894 | 11/1992 | European Pat. Off. . |
| 4-93065 | 3/1992 | Japan . |
| 6-21391 | 1/1994 | Japan . |
| WO92/06498 | 4/1992 | WIPO . |

Primary Examiner—Mahshid D. Saadat
Assistant Examiner—Valencia Martin Wallace
Attorney, Agent, or Firm—McDermott, Will & Emery

[57] ABSTRACT

A semiconductor device comprises silicon substrate 1 on which an integrated circuit is formed, first insulating layer 6 formed on silicon substrate 1, a capacitor comprising lower electrode 7 formed on first insulating layer 6, dielectric film 8 having a high dielectric constant and upper electrode 9, a second insulating film 11 having contact holes 13 which lead to lower electrode 7 and upper electrode 9 independently, diffusion barrier layer 17 which touches lower electrode 7 and upper electrode 9 at the bottom of contact holes 13, and interconnection layer 15 formed on diffusion barrier layer 17. In diffusion barrier layer 17 at the bottom of contact hole 13, a lamellar region made of granular crystal is formed.

5 Claims, 3 Drawing Sheets

F I G. 3
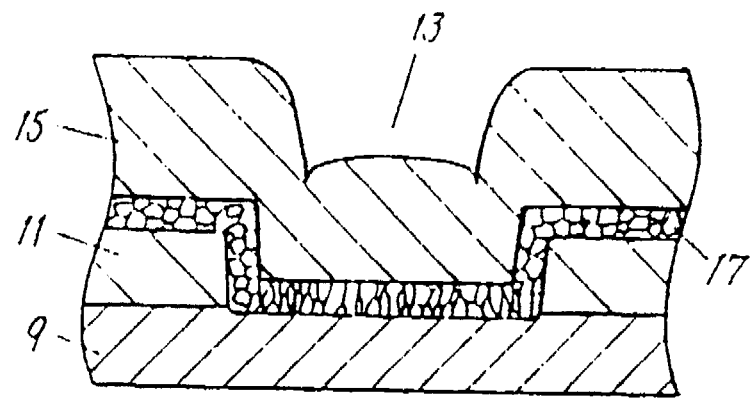
F I G. 4
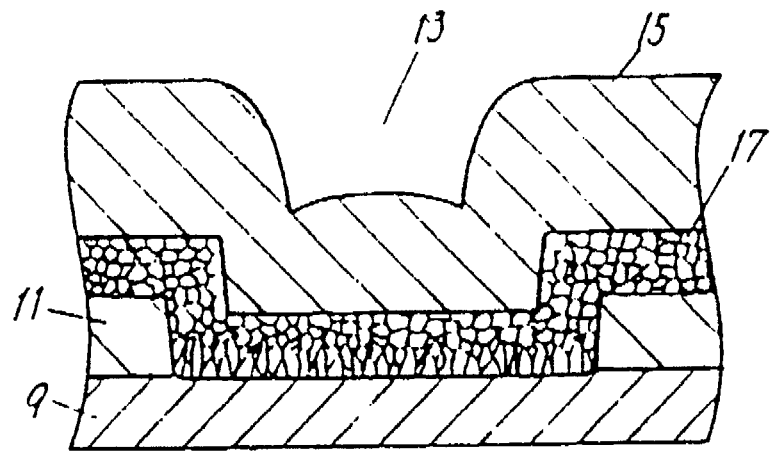

SEMICONDUCTOR DEVICE AND METHOD OF MANUFACTURING THE SAME

FIELD OF THE INVENTION

The present invention relates to a semiconductor device incorporated with a ferroelectric capacitor having a high dielectric constant and a manufacturing method of the same.

BACKGROUND OF THE INVENTION

Information processing at a higher speed under a lower operation voltage becomes popular recently, which entails prevention of noise due to electromagnetic radiation from an electronic instrument. One of the methods to reduce the noise is to incorporate a capacitor having dielectric film with a high dielectric constant such as ferroelectric film into an integrated semiconductor circuit, this technique has drawn attention. A study of commercialising a nonvolatile memory is also active, which makes it possible to read and write at a higher speed under a lower operation voltage by using hysterisis characteristic of ferroelectric film.

A conventional semiconductor device incorporated with a ferroelectric capacitor is explained here by referring to the drawings attached. As FIG. 1 shows, isolation oxide layer 2 is formed on silicon substrate 1, and a transistor comprising diffusion layer 3, gate insulating film 4 and gate electrode 5 is formed in the area surrounded by isolation oxide layer 2. A first insulating film 6 covering the transistor and isolation oxide layer 2 is formed.

A capacitor comprising lower electrode 7, ferroelectric film 8 such as lead zirconate titanate (PZT), etc. and upper electrode 9 is formed on the first insulating film 6. Lower electrode 7 and upper electrode 9 are made of platinum which is chemically stable against a metal oxide such as PZT. A second insulating film 11 is formed on the first insulating film 6 to cover thereon.

Contact holes 12 which leads to diffusion layer 3 are formed through the first and second insulating films 6 and 11, and contact holes 13 which lead to lower electrode 7 and upper electrode 9 are formed on the second insulating 11. Both contact holes are formed by etching. Aluminum interconnection layer 14 electrically connected to diffusion layer 3 through contact holes 12 is formed, and aluminum interconnection layer 15 electrically connected to lower electrode 7 as well as upper electrode 9 through contact holes 13 is also formed independently. If lower electrode 7 and upper electrode 9 touch with interconnection layer 15 directly, aluminum reacts with platinum to yield $Al_2Pt$ during heat treatment, which substantially lowers the connecting strength therebetween. In order to prevent this direct touch, diffusion barrier layer 17 comprising titanium nitride is generally formed in a thickness ranging from 50 nm to 150 nm at the spaces between lower electrode 7 and interconnection layer 15, and upper electrode 9 and interconnection layer 15.

Since silicon substrate 1 where interconnection layers 14 and 15 are formed is in ohmic contact with the interface between interconnection layer 14 and diffusion layer 3, heat treatment at rather higher temperature, higher than 450° C., is given to silicon substrate 1 in inert-gas atmosphere containing hydrogen. And then, passivation layer 16 made of high humid-resisting material such as silicon nitride is formed to cover the transistor and capacitor.

The conventional semiconductor device, with all its diffusion layer 17 having the thickness ranging from 50 nm to 150 nm, connecting strengths at contact holes 13 between lower electrode 7 and interconnection layer 15, and upper electrode 9 and interconnection layer 15 are not sufficient enough. Therefore, some defective continuities occur among many contact holes 13 of a semiconductor device, which proves that the reliability of semiconductor device is not highly enough.

SUMMARY OF THE INVENTION

An object of the present invention is to provide a semiconductor having the higher reliability and a manufacturing method of the same.

The present invention comprises a semiconductor device having, (a) a substrate on which an integrated circuit is formed, (b) a first insulating layer formed on the substrate, (c) a capacitor comprising a lower electrode formed on the first insulating layer, a dielectric film of a high dielectric constant formed on the lower electrode, and an upper electrode formed on the dielectric film, (d) a second insulating layer covering the capacitor and having contact holes which lead both to the lower electrode and upper electrode, (e) a diffusion barrier layer covering at least the inside wall of the contact holes, and at the bottom of the contact holes, touching the lower and upper electrodes, and (f) an interconnection layer formed on the diffusion barrier layer, wherein a lamellar region made of granular crystals is provided.

A preferable thickness of the diffusion barrier layer ranges from 200 nm to 300 nm. The diffusion barrier layer preferably has a dual-layer-structure, namely first and second layers, and the second layer is made of granular crystals.

A manufacturing method of a semiconductor device according to the present invention comprises steps of:

(a) forming a first insulating layer on a substrate where an integrated circuit is formed, (b) forming a capacitor comprising a lower electrode, a dielectric film having a high dielectric constant, and a upper electrode, (c) forming a second insulating layer which covers the capacitor, (d) forming contact holes on the second insulating layer in order to lead to the lower and upper electrodes, (e) forming a diffusion barrier layer covering at least inside wall of the contact holes, and at the bottom of the contact holes, contacting with the lower and upper electrodes, (f) forming an interconnection layer on the diffusion barrier layer, and (g) a heat treatment at a temperature raging from 300° C. to 420° C.

More specifically, a temperature between 300° C. and 380° C. is preferred at step (g), and step (e) is preferably divided into two steps, namely, a first step to form a first layer and a second step to form a second layer.

BRIEF DESCRIPTION OF THE DRAWINGS

FIG. 3 and FIG. 4 are schematic cross sections showing the microstructure of the diffusion barrier layer in one of the contact hole between the capacitor and interconnection layer.

DETAILED DESCRIPTION OF THE INVENTION

Figure 1:
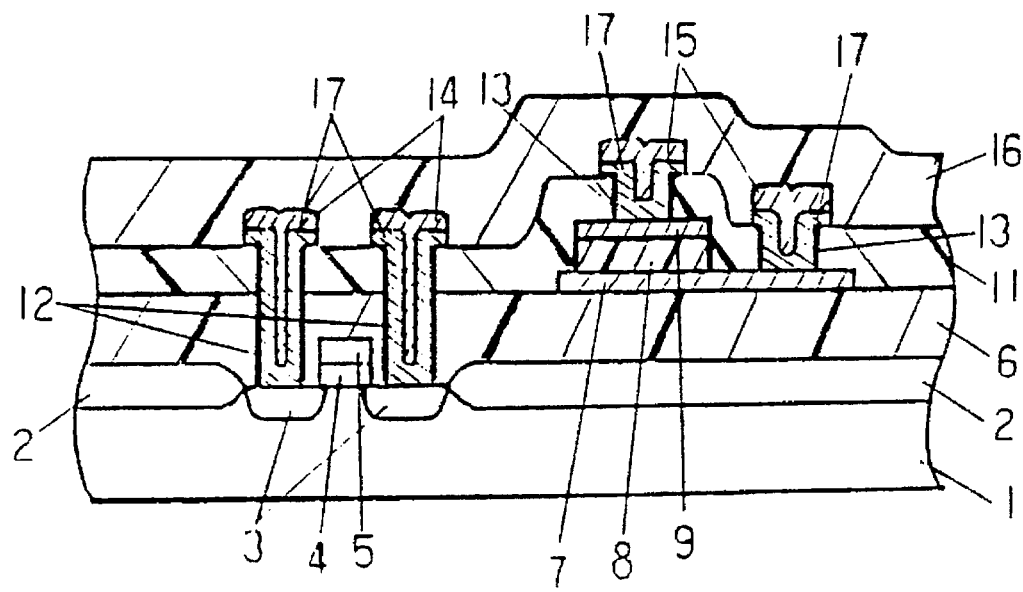
FIG. 1 is a schematic cross section showing the structure of semiconductor device incorporated with a capacitor according to the present invention as well as conventional idea.

The inventors of the present invention made samples with various thickness of the diffusion barrier layer, and under various temperatures at the heat treatment by using the manufacturing method described below:

First, based on the conventional forming method of semiconductor, form isolation oxide layer 2 on silicon substrate 1, then form a transistor comprising diffusion layer 3, gate insulating layer 4 and gate electrode 5 in the area surrounded by isolation oxide layer 2. By using a general CVD method, form a first insulating layer 6 which covers the transistor and isolation oxide layer 2.

Second, form a capacitor comprising lower electrode 7 made of platinum, ferroelectric film 8 made of strontium titanate and upper electrode 9 made of platinum by a regular sputtering method onto the first insulating layer 6. Then, form a second insulating layer 11 on the first insulating layer 9 to cover this capacitor by the regular CVD method.

Third, both on the first insulating layer 9 and the second insulating layer 11, form contact holes 12 which lead to diffusion layer 3, and also form contact holes 13 which lead both to lower electrode 7 and upper electrode 9 by using a regular etching technique. Then, form diffusion barrier layer 17 made of titanium-tungsten alloy to cover the inside wall of contact holes 12 and touches,diffusion layer 3 at the bottom of contact holes 12, and to cover the inside wall of contact holes 13 as well as touch both of lower electrode 7 and upper electrode 9 at the bottom of contact holes 13. Diffusion barrier layer 17 is formed by the sputtering method in Argon gas of 10 mTorr using titunium-tungsten alloy target.

Fourth, form aluminum interconnection layers 14 and 15 on diffusion barrier layer 17 independently by using a regular sputtering method. Then, provide silicon substrate 1 on which interconnection layers 14 and 15 are formed with heat treatment of inert gas containing hydrogen so that ohmic contact is given to the interface between interconnection layer 14 and diffusion layer 3. Then, form passivation layer 16 made of silicon nitride above silicon substrate 1 to cover the transistor and capacitor.

Based on this manufacturing method, various samples are produced with different thickness of the diffusion barrier layer 17 ranging from 150 nm to 350 nm as well as under different temperatures of heat treatment ranging from 200° C. to 450° C. When producing a sample of which thickness of diffusion barrier layer is 200 nm or more, the sputtering is once halted when a thickness reaches to 150 nm, and make vacuous in a chamber before putting argon gas again. Then the sputtering is restored for forming diffusion barrier layer 17 having a specific thickness.

On these samples, the reaction between platinum and aluminum is examined through a microscope at the bottom of contact hole 13 where lower electrode 7, upper electrode 9 and interconnection layer 15 are touched, in order to find defective continuities at contact hole 13. The examination result is shown in FIG. 2.

Figure 2:
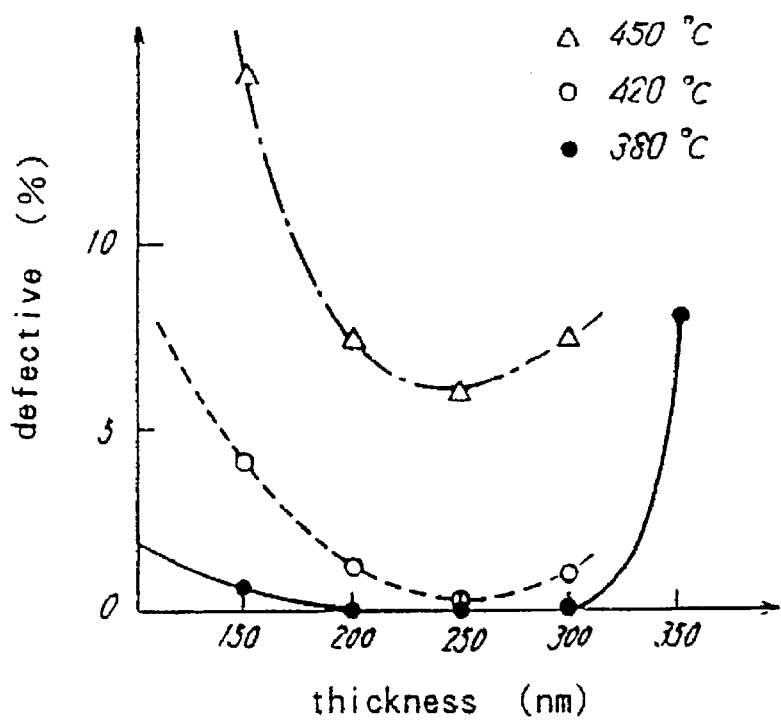
FIG. 2 is a graph showing the relationship between a thickness of the diffusion barrier layer and an incidence of defective continuities.

In FIG. 2, the vertical axis indicates an incidence of the defective continuity, and the horizontal axis indicates a thickness of diffusion barrier layer 17 made of titanate-tungsten alloy. The incidence is calculated in this way: number of contact holes where defective continuities occur vs. approximately 60 contact holes 13 of which diameter is 3 μm.

The examination result reveals a remarkable tendency that under any heat treatments, the incidence of defective continuity decreases when a layer thickness is over 150 nm, and becomes minimum when the layer thickness is between 200 nm and 300 nm; however, the incidence turns increasing when the layer thickness is over 300 nm. Accordingly, the thickness of diffusion barrier layer 17 is preferably between 200 nm and 300 nm.

The incidence of defective continuity in a temperature of heat treatment decreases when the temperature lowers from 450° C. under any layer thicknesses. When the temperature of heat treatment is 420° C. and the layer thickness is between 200 nm and 300 nm, the incidence becomes as low as no more than 2%.

Further, when the temperature of heat treatment becomes 380° C. or less and the layer thickness is between 150 nm and 300 nm, the incidence lowers to 1% or less which is extremely low incidence of the defective. When the layer thickness is between 200 nm and 300 nm in particular, the incidence becomes 0 (zero) and no defective continuities occur at all. On the other hand, when the layer thickness reaches to 350 nm, many cracks possibly due to internal stress occur on diffusion barrier layer 17, and some contact holes show defective continuities.

The heat treatment in 300° C. or more is required because the interface between interconnection layer 14 and diffusion layer 3 loses ohmic contact if the temperature is lower than 300° C.

FIG. 3 and FIG. 4 show the examination report on micro-structure of diffusion barrier layer 17 at contact hole 13. FIG. 3 is a schematic sectional view of contact hole 13 where a defective continuity occurs under this condition:

layer thickness=150 nm heat treatment temperature=450° C.

FIG. 4 is a schematic sectional view of contact hole 13 of which condition is this:

layer thickness=250 nm heat treatment temperature=380° C.

As shown in FIG. 3, at diffusion barrier layer 17 in contact hole 13 where a defective continuity occurs columnar crystal structure that crystal grains vertically grow against the surface of upper electrode 9 is observed. In this diffusion barrier layer 17, many crystal grain boundaries in vertical direction but few in horizontal direction are observed. As a result, diffusions of platinum and aluminum easily occur along grain boundaries to produce Al Pt which causes defective continuities.

On the other hand, as shown in FIG. 4, at diffusion barrier layer 17 in contact hole 13 where no defective continuities are observed, a lamellar region of granular crystal structure having no crystal orientation is formed near the surface of interconnection layer 15, though some columnar crystal structure is observed near the surface of upper electrode 9. In this diffusion barrier layer 17, so many crystal grain boundaries in horizontal direction are observed because lamellar regions of granular crystal structure are formed. As a result, this crystal grain boundaries in horizontal direction prevent platinum and aluminum from diffusion, and AlPt is hard to be produced.

The defective discontinuities at contact hole 13 are thus substantially prevented from occurring by forming a lamellar structure composed of granular crystal grains in diffusion barrier layer 17. In order to gain the lamellar region of granular crystal structure, the thickness of diffusion barrier layer 17 preferably ranges from 200 to 300 nm. An intermittent sputtering instead of continuous sputtering is preferred before gaining a specified thickness. Another preferable condition is a temperature of heat treatment: $Al_2Pt$ is hard to produce at the temperature raging from 300° to 420° C., in particular, it is hardly produced at the temperature of 380° C. or less.

Figure 5:
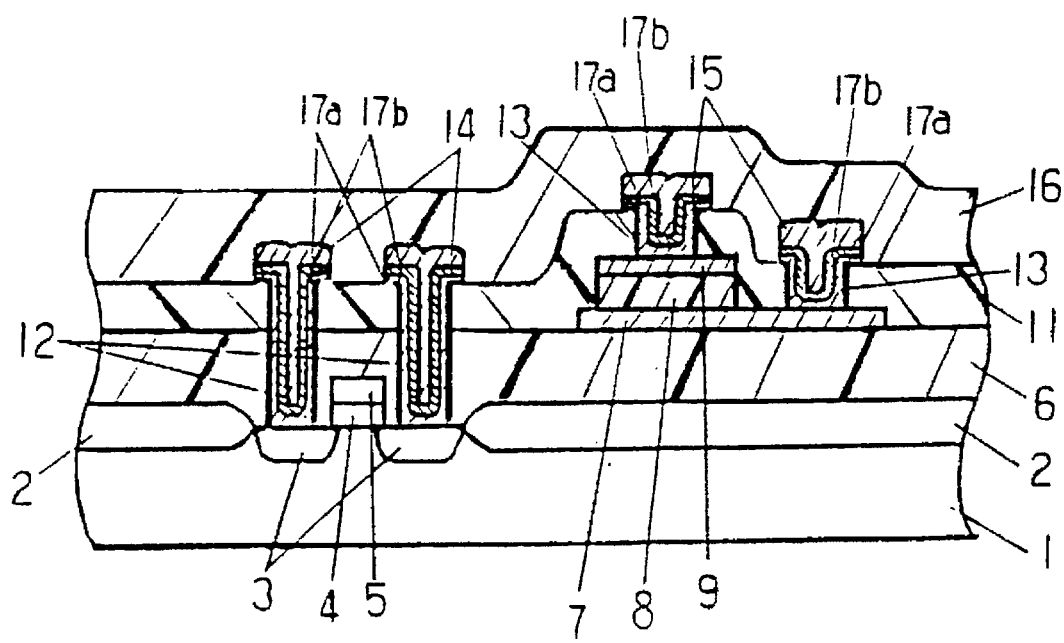
FIG. 5 is a schematic cross section showing the structure of the semiconductor device having dual layers in the diffusion barrier layer according to the present invention.
Figure 6:
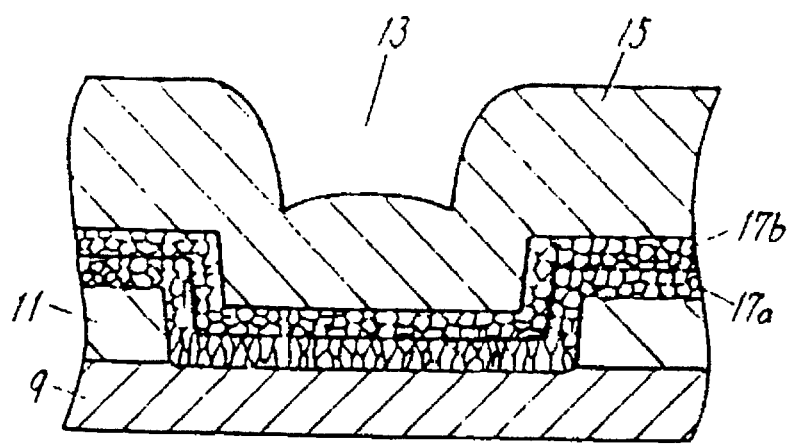
FIG. 6 is a schematic cross section showing the microstructure of the diffusion barrier layer with dual layers in one of the contact holes between the capacitor and interconnection layer.

FIG. 5 and FIG. 6 show a case where dual diffusion barrier layers are formed.

First, form the transistor and capacitor on silicon substrate 1 by the same method as the above exemplary embodiment, then form the second insulating film 11 having contact holes 12 and 13.

Second, form a first diffusion barrier layer 17a of which thickness is 100 nm and made of titanium-tungsten alloy by using a sputtering method in argon gas. This first diffusion barrier layer 17a is formed to cover the inside wall of contact holes 12 and to touch diffusion layer 3 at the bottom of contact holes 12 as well as to cover the inside wall of contact holes 13 and to touch lower electrode 7 and upper electrode 9 at the bottom of contact holes 13. Then, take out this silicon substrate 1 into the air and put it into another sputtering chamber in order to form a second diffusion barrier layer 17b of which thickness is 150 nm and made of the same alloy by using the sputtering method.

Third, form aluminum interconnection layers 14 and 15 on the second diffusion barrier layer 17b by the sputtering method. Provide silicon substrate 1 where interconnection layers 14 and 15 are formed with heat treatment at 350° C. in inert gas atmosphere containing hydrogen in order to give ohmic contact to an interface between interconnection layer 14 and diffusion layer 3. Then, form passivation layer 16 made of silicon nitride above the entire silicon substrate 1 to cover the transistor and capacitor.

The samples produced through the above manufacturing method have no defective continuities at a contact holes 13. FIG. 6 shows the monitoring result of microstructure of diffusion barrier layers 17a and 17b at contact hole 13. The first diffusion barrier layer 17a which borders on upper electrode 9 has columnar crystal structure while the second counterpart 17b which borders on interconnection layer 15 has granular crystal structure.

As explained above, when splitting the forming process of the diffusion barrier layer into two steps, the diffusion barrier layer which has granular crystal structure is gained in ease. When dividing the forming process into three steps or more, the granular crystal structure is also easily gained in the diffusion barrier layer.

The total thickness of the first and second diffusion barrier layers preferably ranges from 200 to 300 nm. When the total thickness is less than 200 nm, the prevention effect of platinum and aluminum diffusion by the second diffusion barrier layer 17b decreases, and when the total thickness is over 300 nm, cracks easily occur on diffusion barrier layers 17a and 17b.

The thickness of 17b is preferably thicker than that of 17a because it forms granular crystal structure more in ease. The thickness of the second diffusion barrier layer 17b in particular ranges preferably from ½ to ⅔ of the total thickness of 17a and 17b. For example, when the total thickness is between 200 and 300 nm, the layer thickness of the second diffusion barrier layer is preferred to be between 100 and 200 nm.

The heat treatment temperature ranging from 300° to 420° C. is also proper for forming the dual diffusion barrier layers because if the temperature exceeds 420° C., it is hard to produce $Al_2Pt$. $Al_2Pt$ is hardly produced at the temperature of 380° C. or less.

Although illustrated and described herein with reference to certain specific embodiments, the present invention is nevertheless not intended to be limited to the details shown. Rather, various modifications may be made in the details within the scope and ranges of equivalents of the claims and without departing from the spirit of the invention.

For example, titanium-tungsten nitride or titanium nitride can be used instead of titanium-tungsten alloy which is shown in the above exemplary embodiment as a material of the diffusion barrier layer. Further, electron-beam evaporation method can be used instead of sputtering method when forming the diffusion barrier layer.

Aluminum is used as a material of the interconnection layer in the above exemplary embodiment, but other alloys of which major component is aluminum can be used instead. Also, instead of platinum as an electrode material of the capacitor, other alloys of which major component is platinum can be used. For the dielectric film of the capacitor, barium titanate, PZT, PLZT or other metal oxide materials which have high dielectric constant can be used instead of a material of strontium titanate system shown in the above exemplary embodiment.

What is claimed is:

1. A semiconductor device comprising:

(a) a substrate wherein an integrated circuit is formed, (b) a first insulating layer formed on said substrate, (c) a capacitor comprising a lower electrode formed on said first insulating layer, a dielectric film having a high dielectric constant formed on said lower electrode, and an upper electrode formed on said dielectric film, (d) a second insulating layer covering said capacitor and having contact holes leading to said lower electrode and upper electrode respectively, (e) a diffusion barrier layer covering at least inside walls of said contact holes, and touching said lower electrode as well as said upper electrode at the bottom of said contact holes, said diffusion barrier layer including a lamellar region comprised of granular crystal structure at the bottom of said contact holes having a thickness ranging from 200 nm to 300 nm, and (f) an interconnection layer formed on said diffusion barrier layer.

2. A semiconductor device comprising:

a substrate wherein an integrated circuit is formed;

a first insulating layer formed on said substrate;

a capacitor comprising a lower electrode formed on said first insulating layer, a dielectric film having a high dielectric constant formed on said lower electrode, and an upper electrode formed on said dielectric film;

a second insulating layer covering said capacitor and having contact holes leading to said lower electrode and upper electrode respectively;

a first diffusion barrier layer covering at least inside walls of said contact holes, and touching said lower electrode and upper electrode at each bottom of said contact holes;

a second diffusion barrier layer formed on said first diffusion barrier layer; and an interconnection layer formed on said second diffusion barrier layer, wherein said first and second diffusion barrier layers are composed of a same material and have different crystal grain structures at each bottom of said contact holes.

3. The semiconductor device of claim 2 wherein said second diffusion barrier layer has granular crystal structure.

4. The semiconductor device of claim 3, wherein a total thickness of said first and second diffusion barrier layers ranges from 200 nm to 300 nm.

5. The semiconductor device of claim 3, wherein a thickness of said second diffusion barrier layer is thicker than that of said first diffusion barrier layer.

* * * * *